(12) United States Patent
Kang

(10) Patent No.: US 8,648,348 B2
(45) Date of Patent: Feb. 11, 2014

(54) LIGHT EMITTING DEVICE, LIGHT EMITTING DEVICE PACKAGE, AND LIGHTING SYSTEM

(75) Inventor: Dae Sung Kang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 338 days.

(21) Appl. No.: 13/020,379

(22) Filed: Feb. 3, 2011

(65) Prior Publication Data

US 2011/0186857 A1 Aug. 4, 2011

(30) Foreign Application Priority Data

Feb. 4, 2010 (KR) .................. 10-2010-0010205

(51) Int. Cl.
*H01L 29/15* (2006.01)
*H01L 31/0256* (2006.01)

(52) U.S. Cl.
USPC .............. 257/76; 257/E27.121; 257/E33.006; 257/E33.025

(58) Field of Classification Search
USPC ........................................................ 257/76
See application file for complete search history.

(56) References Cited

U.S. PATENT DOCUMENTS

| | | | |
|---|---|---|---|
| 2005/0179130 A1* | 8/2005 | Tanaka et al. ................. | 257/730 |
| 2006/0267025 A1* | 11/2006 | Wuu et al. ....................... | 257/79 |
| 2007/0085093 A1* | 4/2007 | Ohmae et al. .................. | 257/89 |
| 2007/0257269 A1* | 11/2007 | Cho et al. ........................ | 257/95 |
| 2009/0078954 A1 | 3/2009 | Shim et al. ...................... | 257/98 |
| 2009/0315056 A1 | 12/2009 | Kim ................................ | 257/98 |
| 2010/0197055 A1 | 8/2010 | Tanaka et al. .................. | 438/29 |

FOREIGN PATENT DOCUMENTS

| | | |
|---|---|---|
| JP | 2005-064492 A | 3/2005 |
| JP | 2005-101566 A | 4/2005 |
| KR | 10-0825137 B1 | 4/2008 |
| KR | 10-2008-0088278 A | 10/2008 |
| KR | 10-2010-0042041 A | 4/2010 |

OTHER PUBLICATIONS

Chinese Office Action dated Oct. 10, 2012 issued in Application No. 201110036281.2.
Korean Office Action dated Jun. 11, 2010 issued in Application No. 10-2010-0010205.
Korean Office Action dated Sep. 30, 2010 issued in Application No. 10-2010-0010205.

* cited by examiner

*Primary Examiner* — Matthew Landau
*Assistant Examiner* — Igwe U Anya
(74) *Attorney, Agent, or Firm* — KED & Associates LLP

(57) ABSTRACT

Provided is a light emitting device according to one embodiment including: a substrate which has protrusions on the C-face, and of which unit cells are constructed in a hexagonal structure; a semiconductor layer which is formed on the substrate, in which empty spaces are formed in sides of the protrusions, and of which unit cells are constructed in a hexagonal structure; and a light emitting structure layer comprising a first conductive semiconductor layer, a second conductive semiconductor layer, and an active layer formed between the first conductive semiconductor layer and second conductive semiconductor layer which are formed on the semiconductor layer, wherein the A-face of the substrate and the A-face of the semiconductor layer form an angle of greater than zero degree, and the protrusions include the R-faces.

20 Claims, 7 Drawing Sheets

LIGHT EMITTING DEVICE, LIGHT EMITTING DEVICE PACKAGE, AND LIGHTING SYSTEM

CROSS-REFERENCE TO RELATED APPLICATIONS

The present application claims priority OF Korean Patent Application No. 10-2010-0010205 filed on Feb. 4, 2010, which is hereby incorporated by reference in its entirety.

BACKGROUND

The present disclosure relates to a light emitting device, a light emitting device package, and a lighting system.

Light Emitting Diodes (LEDs) are frequently used as the light emitting device.

The LEDs are a semiconductor light emitting device which transforms electric current into light.

Wavelengths of light emitted from such LEDs vary according to semiconductor materials used in manufacturing the LEDs. This is so since the wavelengths of the emitted light vary according to band-gaps of the semiconductor materials representing energy differences between valence band electrons and conduction band electrons.

Brightness of the LEDs has been gradually increased such that the LEDs are used as light sources for displays, automobiles, and lighting, and it is possible to realize LEDs emitting white light with excellent efficiency by using phosphor or combining LEDs of various colors.

SUMMARY

Embodiments provide a light emitting device, a light emitting device package, and a lighting system.

Embodiments also provide a light emitting device with improved light extraction efficiency, a light emitting device package, and a lighting system.

A light emitting device according to one embodiment includes: a substrate which has protrusions on the C-face, and of which unit cells are constructed in a hexagonal structure; a semiconductor layer which is formed on the substrate, in which empty spaces are formed in sides of the protrusions, and of which unit cells are constructed in a hexagonal structure; and a light emitting structure layer comprising a first conductive semiconductor layer, a second conductive semiconductor layer, and an active layer formed between the first conductive semiconductor layer and second conductive semiconductor layer which are formed on the semiconductor layer, wherein the A-face of the substrate and the A-face of the semiconductor layer form an angle of greater than zero degree, and the protrusions include the R-faces.

A light emitting device package according to another embodiment includes: a package body; a first electrode and a second electrode electrically separated from each other on the package body; a light emitting device electrically connected to the first electrode and second electrode on the package body; and a molding member surrounding the light emitting device on the package body, wherein the light emitting device includes: a substrate which has protrusions on the C-face, and of which unit cells are constructed in a hexagonal structure; a semiconductor layer which is formed on the substrate, in which empty spaces are formed in sides of the protrusions, and of which unit cells are constructed in a hexagonal structure; and a light emitting structure layer comprising a first conductive semiconductor layer, a second conductive semiconductor layer, and an active layer formed between the first conductive semiconductor layer and second conductive semiconductor layer which are formed on the semiconductor layer, wherein the A-face of the substrate and the A-face of the semiconductor layer form an angle of greater than zero degree, and the protrusions include the R-faces.

A lighting system using light emitting devices as a light source according to still further another embodiment includes a light emitting module comprising one or more light emitting devices, wherein the light emitting device includes: a substrate which has protrusions on the C-face, and of which unit cells are constructed in a hexagonal structure; a semiconductor layer which is formed on the substrate, in which empty spaces are formed in sides of the protrusions, and of which unit cells are constructed in a hexagonal structure; and a light emitting structure layer comprising a first conductive semiconductor layer, a second conductive semiconductor layer, and an active layer formed between the first conductive semiconductor layer and second conductive semiconductor layer which are formed on the semiconductor layer, wherein the A-face of the substrate and the A-face of the semiconductor layer form an angle of greater than zero degree, and the protrusions include the R-faces.

The details of one or more embodiments are set forth in the accompanying drawings and the description below. Other features will be apparent from the description and drawings, and from the claims.

DETAILED DESCRIPTION OF THE EMBODIMENTS

Figure 1:
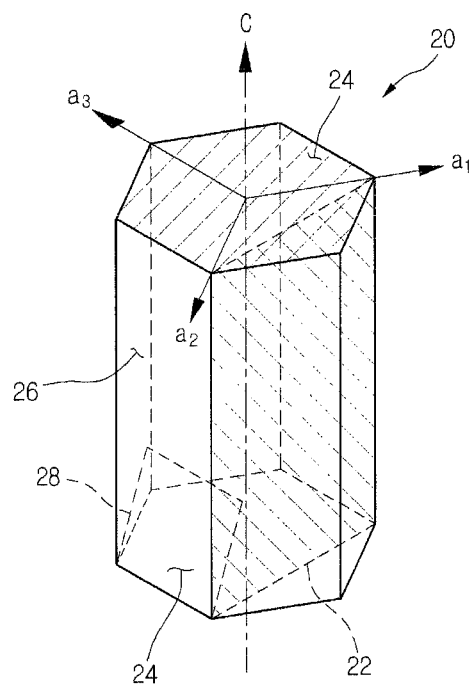
FIG. 1 is a view describing the crystal structure of sapphire.

Reference will now be made in detail to the embodiments of the present disclosure, examples of which are illustrated in the accompanying drawings.

A light emitting device according to an embodiment will be described in detail with reference to the accompanying drawings. The invention may, however, be embodied in many different forms and should not be construed as being limited to the embodiments set forth herein; rather, that alternate embodiments included in other retrogressive inventions or falling within the spirit and scope of the present disclosure can easily be derived through adding, altering, and changing, and will fully convey the concept of the invention to those skilled in the art.

In the descriptions of embodiments, it will be understood that when a layer (or film), a region, a pattern, or a structure is referred to as being 'on/above/over/upper' substrate or 'under/below/lower' substrate, the 'on/above/over/upper' substrate and 'under/below/lower' substrate comprise each layer (or film), a region, a pad, or patterns, which can be directly formed on substrate as well as each layer (or film), the region, the pad, or the patterns, which can be indirectly formed under another layer (film), another region, another pad, or another patterns, with one or more intervening layers may also being present. Therefore, meaning thereof should be judged according to the spirit of the present disclosure.

Thickness or size of each layer in the drawings has been exaggerated, omitted, or roughly illustrated for the convenience and clarity of the description. Further, sizes of the respective components do not entirely reflect actual sizes thereof.

Hereinafter, light emitting devices and light emitting device packages according to embodiments are described in detail by referring to the attached drawings.

FIG. 1 is a view describing the crystal structure of sapphire.

A sapphire unit cell 20 has a hexagonal structure. Positions and directions of A-plane 22, C-plane 24, M-plane 26, and R-plane 28 of the sapphire unit cell 20 are disclosed in FIG. 1. The A-plane 22 is perpendicular to the C-plane 24, and the M-plane 26 forms a side of the sapphire unit cell 20. The R-plane 28 is inclined to an angle of 57.6 with respect to the C-plane 24. The sapphire unit cell 20 has an a1-axis, an a2-axis, and an a3-axis which cross one another to an angle of 120 degrees on the same plane, and a c-axis which is perpendicular to the plane.

Figure 2:
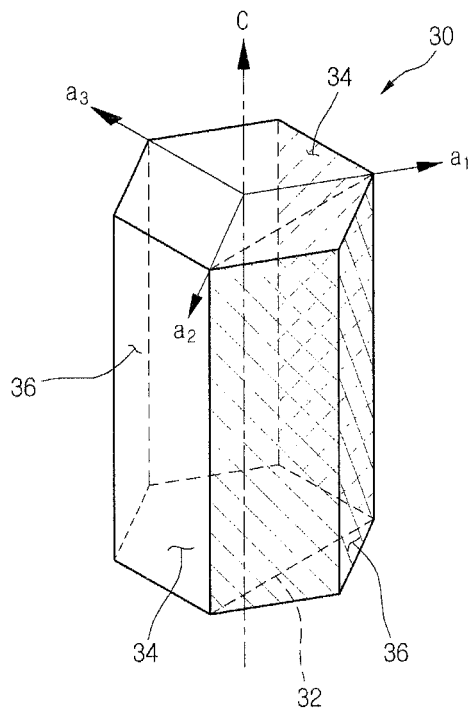
FIG. 2 is a view illustrating unit cells of GaN that is a III-V group nitride compound semiconductor.

FIG. 2 is a view illustrating unit cells of GaN that is a III-V group nitride compound semiconductor.

A GaN unit cell 30 has a hexagonal structure, and includes M-planes 36 that form sides of the GaN unit cell 30, C-planes 34 that form C-faces of the top side and the bottom side, and A-planes 32 that are perpendicular to the C-planes 34.

When growing GaN on such a C-face of sapphire, the GaN is grown in a way that lattice arrangement of GaN is angled to an angle of 30 degrees with respect to that of sapphire. Namely, when cutting a sapphire in which the GaN has been grown in a direction that is perpendicular to the C-face, the M-planes 36 of the GaN on the sapphire are exposed if the A-planes 32 of the sapphire are exposed. The A-face of the sapphire is parallel to the M-face of the GaN.

Figure 3:
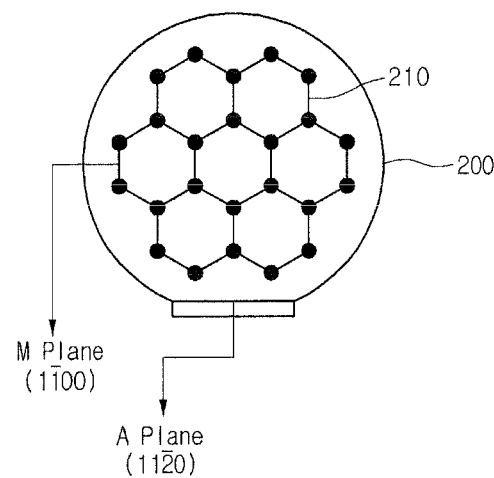
FIG. 3 is a view illustrating atoms arranged in the C-face of a sapphire substrate.
Figure 4:
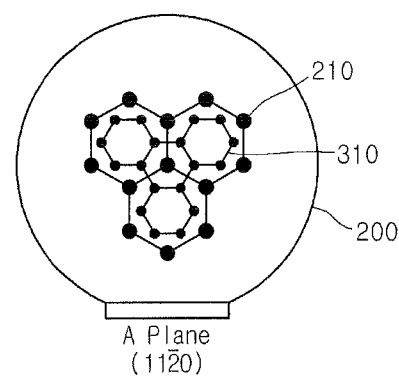
FIG. 4 is a view describing atoms arranged in the C-face of the sapphire substrate, and atomic arrangement of GaN.

FIG. 3 is a view illustrating atoms arranged in the C-face of a sapphire substrate, and FIG. 4 is a view describing atoms arranged in the C-face of the sapphire substrate, and atomic arrangement of GaN.

An atomic arrangement 210 of sapphire formed on the C-face of the sapphire substrate 200 is illustrated in FIGS. 3 and 4, and an atomic arrangement 310 of GaN formed on the C-face of the sapphire substrate 200 is illustrated in FIG. 4

Since Ga atoms are positioned such that lattice-mismatch is less occurred when growing a GaN layer on the C-face of the sapphire substrate 200, the GaN layer is grown as the atomic arrangement 310 of GaN is being twisted to an angle of 30 degrees with respect to the atomic arrangement 210 of sapphire as illustrated in FIG. 4.

When growing the GaN layer on the C-face of the sapphire substrate 200, the GaN layer is grown in the C-face direction. However, the A-face of the GaN layer is grown in a way that the A-face of the GaN layer corresponds to the M-face of the C-face of the sapphire substrate 200, and the M-face of the GaN layer is grown in a way that the M-face of the GaN layer corresponds to the A-face of the C-face of the sapphire substrate 200.

Further, the A-face of the sapphire substrate 200 and the A-face of the GaN layer form an angle of more than 0 degree. For instance, the A-face of the sapphire substrate 200 and the A-face of the GaN layer may form an angle of 30 degrees.

Figure 5:
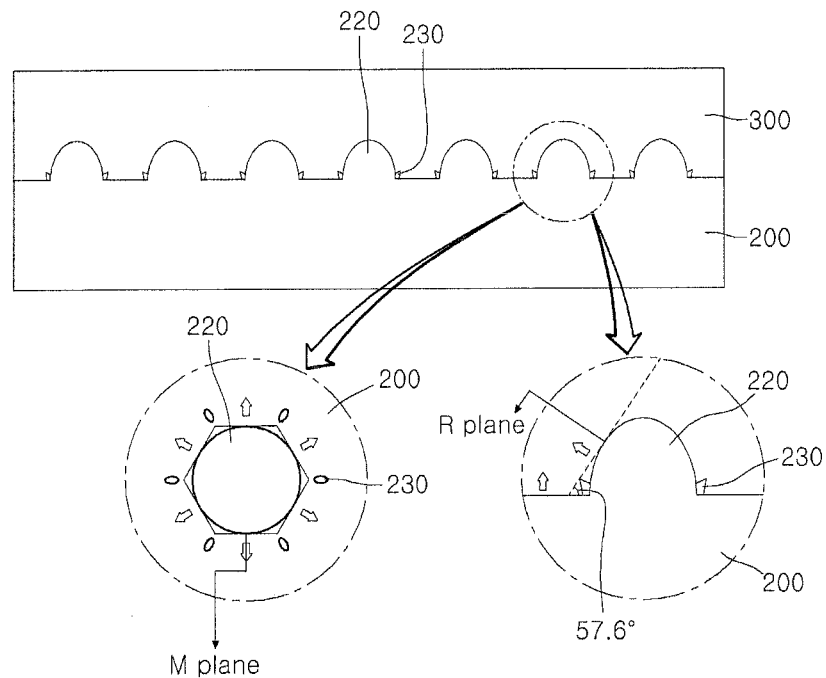
FIG. 5 is a view illustrating that protrusions have been formed and a GaN layer has been grown on the C-face of the sapphire substrate.
Figure 6:
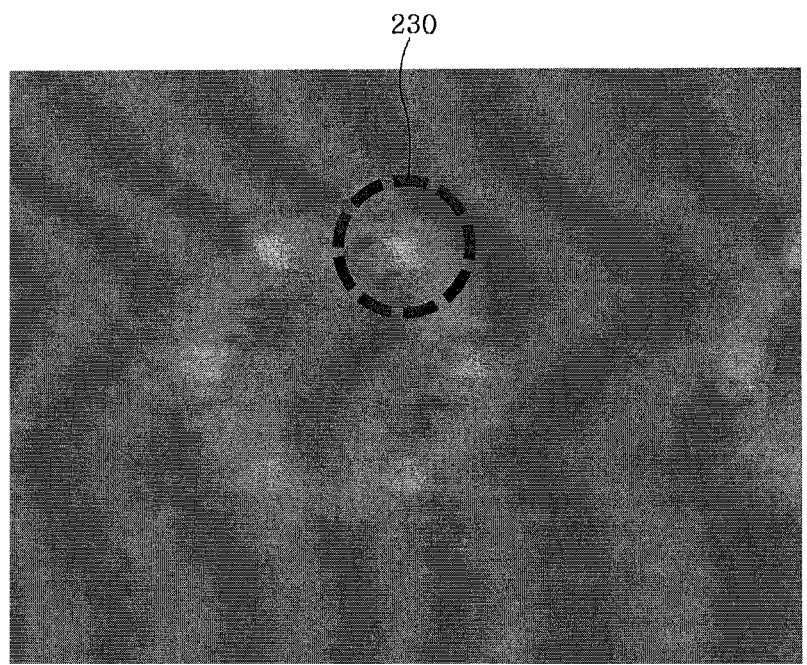
FIG. 6 is a photograph of an optical microscope describing empty spaces formed in one sides of the protrusions on the C-face of the sapphire substrate.

FIG. 5 is a view illustrating that protrusions have been formed and a GaN layer has been grown on the C-face of the sapphire substrate, and FIG. 6 is a photograph of an optical microscope describing empty spaces formed in one sides of the protrusions on the C-face of the sapphire substrate.

The C-face of the sapphire substrate 200 is selectively removed such that one or more protrusions 220 are formed on the C-face of the sapphire substrate, and the GaN layer 300 is grown such that empty spaces 230 are formed in one side of the protrusions.

The protrusions 220 are formed in an approximately circular planar shape as illustrated in a left enlarged view of FIG. 5, and the protrusions 220 are formed in an approximately hemispherical cross-sectional shape including the R-face as illustrated in a right enlarged view of FIG. 5. The protrusions 220 may include the R-face such that the empty spaces 230 may be formed more effectively. That is, a plane of the R-face may be formed between the highest side and the lowest side of the protrusions 220.

When growing a GaN layer 300 on the C-face of the sapphire substrate 200 having an approximately circular planar shape as illustrated in the left enlarged view of FIG. 5, the GaN layer 300 is grown in the direction from the A-face to the C-face and grown mainly in the direction from the M-face to the R-plane having semi-polarization as illustrated as arrows in the left enlarged view of FIG. 5.

Further, when growing the GaN layer 300 on the C-face of the sapphire substrate 200 having an approximately hemispherical cross-sectional shape as illustrated in the right enlarged view of FIG. 5, the GaN layer 300 is grown in the direction from the R-face of the protrusions 220 to the A-face thereof and grown mainly in the direction of the C-face in the C-plane sapphire substrate 200 as illustrated as arrows in the right enlarged view of FIG. 5.

Empty spaces 230 are formed in sides of six portions at which M-faces of the protrusions 220 encounter as illustrated in FIGS. 5 and 6 since a GaN layer 300 grown on the C-face of the sapphire substrate 200 and a GaN layer 300 grown on the protrusions 220 vary in the growth rate depending on the growth direction.

The C-face of the sapphire substrate 200 has a refractive index of about 1.7, and the empty spaces 230 have a refractive index of about 1. Therefore, light passing through regions in which the empty spaces 230 are formed is scattered while it is being reflected and refracted by a refractive index of the C-face of the sapphire substrate 200 and that of the empty spaces 230. Accordingly, light extraction efficiency can be improved by forming the empty spaces 230 in the C-face of the sapphire substrate 200.

Figure 7:
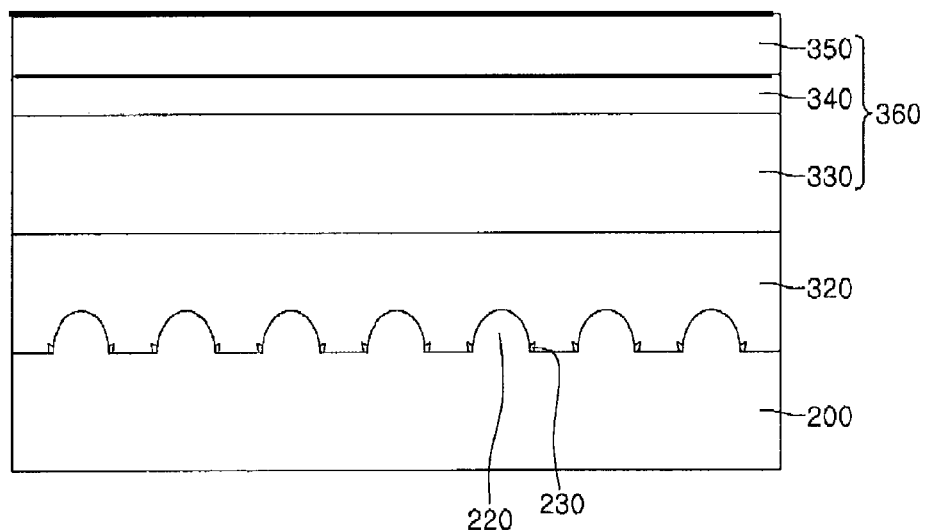
FIGS. 7 and 8 are views describing a light emitting device according to an embodiment, and a method of manufacturing the light emitting device.
Figure 8:
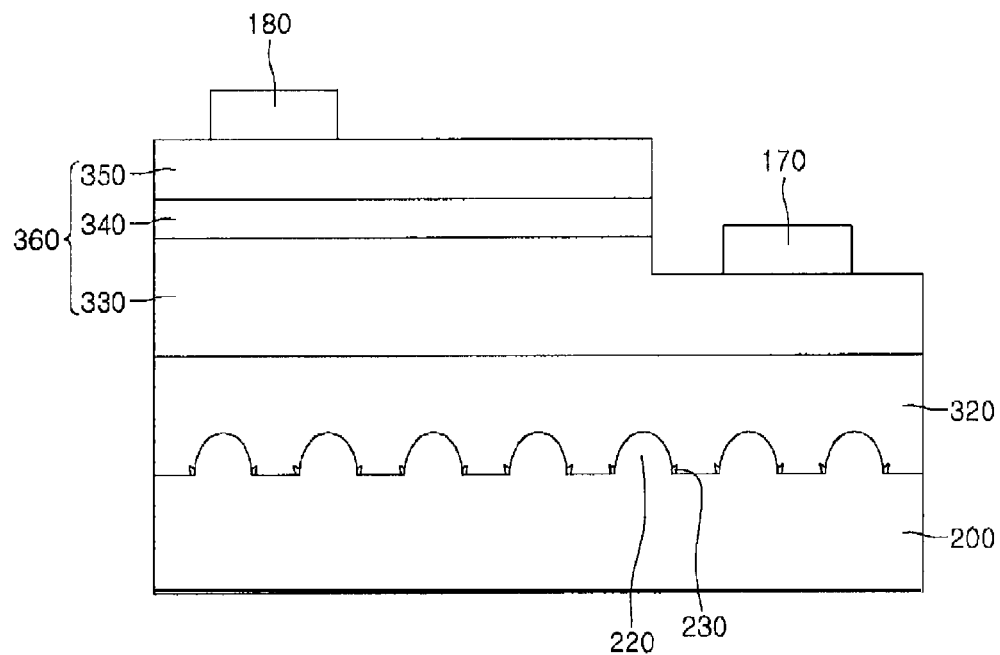

FIGS. 7 and 8 are views describing a light emitting device according to an embodiment, and a method of manufacturing the light emitting device.

Referring to FIG. 7, one or more protrusions 220 are formed by preparing the C-face of the sapphire substrate 200 and etching the top side of the C-face of the sapphire substrate 200, thereby selectively removing the top side of the C-face of the sapphire substrate 200. The protrusions 220 may be formed in such a shape that is described in FIG. 5.

An undoped semiconductor layer 320 and a light emitting structure layer 360 including a first conductive semiconductor layer 330, an active layer 340, and a second conductive semiconductor layer 350 are formed on the C-face of the sapphire substrate 200 in which the protrusions 220 are formed.

For instance, the undoped semiconductor layer 320 may be formed as an undoped GaN layer.

The empty spaces 230 are formed in one side of the protrusions 220 as described in FIG. 5 when forming a GaN-based semiconductor layer such as the undoped semiconductor layer 320 on the C-face of the sapphire substrate 200 in which the protrusions 220 are formed.

Further, a GaN layer may be formed on the C-face of the sapphire substrate 200 without forming the undoped semiconductor layer 320, or the first conductive semiconductor layer 330 such as a GaN layer into which first conductive impurities are injected may be directly grown. The empty spaces 230 are formed in one side of the protrusions 220 also in this case.

The light emitting structure layer 360 may include plural compound semiconductor layers of group III to group V elements. For instance, the light emitting structure layer 360 may include a first conductive semiconductor layer 330, an active layer 340 formed on the first conductive semiconductor layer 330, and a second conductive semiconductor layer 350 formed on the active layer 340.

For instance, the first conductive semiconductor layer 330 may include an n type semiconductor layer, wherein the n type semiconductor layer may be formed from semiconductor materials having a composition expression of $In_xAl_yGa_{1-x-y}N$ ($0 \leq x \leq 1, 0 \leq y \leq 1, 0 \leq x+y \leq 1$) selected from InAlGaN, GaN, AlGaN, AlInN, InGaN, AlN, and InN, and wherein n type dopants including Si, Ge and Sn may be doped on the n type semiconductor layer. The first conductive semiconductor layer 330 may be formed in a single layer or multiple layers, and the first conductive semiconductor layer 330 is not limited thereto.

The active layer 340 is formed under the first conductive semiconductor layer 330, and may include a Single Quantum Well structure, a Multiple Quantum Well structure, a Quantum Dot structure, or a Quantum Wire structure. The active layer 340 may be formed from semiconductor materials having a composition expression of $In_xAl_yGa_{1-x-y}N$ ($0 \leq x \leq 1, 0 \leq y \leq 1, 0 \leq x+y \leq 1$). When the active layer 340 is formed in the Multiple Quantum Well structure, the active layer 340 may be formed by laying up plural well layers and plural barrier layers. For instance, an InGaN well layer and a GaN barrier layer are periodically laid up to form the active layer 340.

A clad layer (which is not shown in drawings) formed by doping an n type or p type dopant on the top and/or bottom of the active layer 340 may be formed, and the clad layer (which is not shown in drawings) may be embodied into an AlGaN layer or InAlGaN layer.

For instance, the second conductive semiconductor layer 350 is formed under the active layer 340 and may be embodied into a p type semiconductor layer, wherein the p type semiconductor layer may be formed from semiconductor materials having a composition expression of $In_xAl_yGa_{1-x-y}N$ ($0 \leq x \leq 1, 0 \leq y \leq 1, 0 \leq x+y \leq 1$) selected from InAlGaN, GaN, AlGaN, InGaN, AlInN, AlN, and InN, and wherein p type dopants including Mg, Zn, Ca, Sr, and Ba may be doped on the p type semiconductor layer.

The second conductive semiconductor layer 350 may be formed in a single layer or multiple layers, and the second conductive semiconductor layer 350 is not limited thereto.

On the other hand, the first conductive semiconductor layer 330 may include a p type semiconductor layer, and the second conductive semiconductor layer 350 may include an n type semiconductor layer in the light emitting structure layer 360 differently from the light emitting structure layer 360 described above. Further, a third conductive semiconductor layer (which is not shown in drawings) including an n type or p type semiconductor layer may be formed on the second conductive semiconductor layer 350. Accordingly, the light emitting structure layer 360 may have one or more of np, pn, npn, and pnp junction structures. Further, a conductive dopant within the first conductive semiconductor layer 330 and the second conductive semiconductor layer 350 may be formed in a uniform or non-uniform doping concentration. Namely, the light emitting structure layer 360 may be constructed in various structures, and the light emitting structure layer 360 is not limited thereto.

Referring to FIG. 8, the light emitting structure layer 360 is selectively removed such that the first conductive semiconductor layer 330 is partially exposed in the upward direction. Then a first electrode unit 170 is formed on the first conductive semiconductor layer 330, and a second electrode unit 180 is formed on the second conductive semiconductor layer 350. Therefore, a light emitting device according to an embodiment may be fabricated.

In the foregoing light emitting device, light is generated from the active layer 340 as the power supply is being applied to the first electrode unit 170 and the second electrode unit 180, and a portion of the light generated from the active layer 340 is proceeded in the direction of the C-face of the sapphire substrate 200 such that the portion of the light is reflected, refracted, and scattered in the empty spaces 230. Therefore, the scattered light is extracted more effectively to the outside of the light emitting device such that light efficiency of the light emitting device can be improved.

Figure 9:
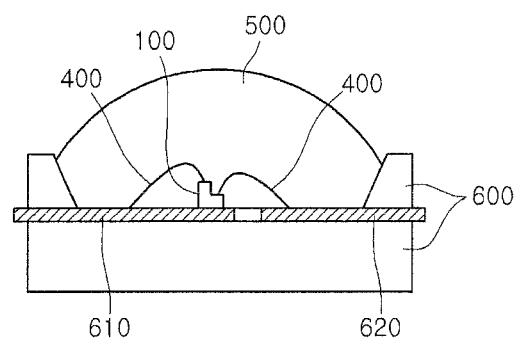
FIG. 9 is a view describing a light emitting device package in which light emitting devices according to embodiments are installed.

FIG. 9 is a view describing a light emitting device package in which light emitting devices according to embodiments are installed.

Referring to FIG. 9, a light emitting device package according to an embodiment includes a package body 600, a first electrode 610 and a second electrode 620 installed on the package body 600, a light emitting device 100 installed on the package body 600 and electrically connected to the first electrode 610 and second electrode 620, and a molding member 500 surrounding the light emitting device 100.

The package body 600 may be formed from material selected from silicon, synthetic resins, and metals, and an inclined plane may be formed around the light emitting device 100.

The first electrode 610 and second electrode 620 are electrically separated from each other and play a role of providing the light emitting device 100 with the power supply. Further, the first electrode 610 and second electrode 620 may play a role of increasing light efficiency by reflecting light generated from the light emitting device 100, or may play a role of emitting heat generated from the light emitting device 100 to the outside.

The light emitting device 100 may be installed on the package body 600, or on the first electrode 610 or second electrode 620.

The light emitting device 100 may be electrically connected to the first electrode 610 and second electrode 620 through a wire 400.

The molding member 500 may protect the light emitting device 100 by surrounding the light emitting device 100.

Further, the molding member 500 comprises a phosphor to vary wavelength of light emitted from the light emitting device 100.

Plural light emitting device packages according to an embodiment may be arrayed on a board, and optical members such as light guide plate, prism sheet, diffusion sheet, and fluorescent sheet may be arranged in the path of lights emitted from the light emitting device packages. Such light emitting device package, board, and optical member may function as a back light unit or lighting unit. For instance, a lighting system may include a back light unit, a lighting unit, an indication unit, a lamp, and a street lamp.

Figure 10:
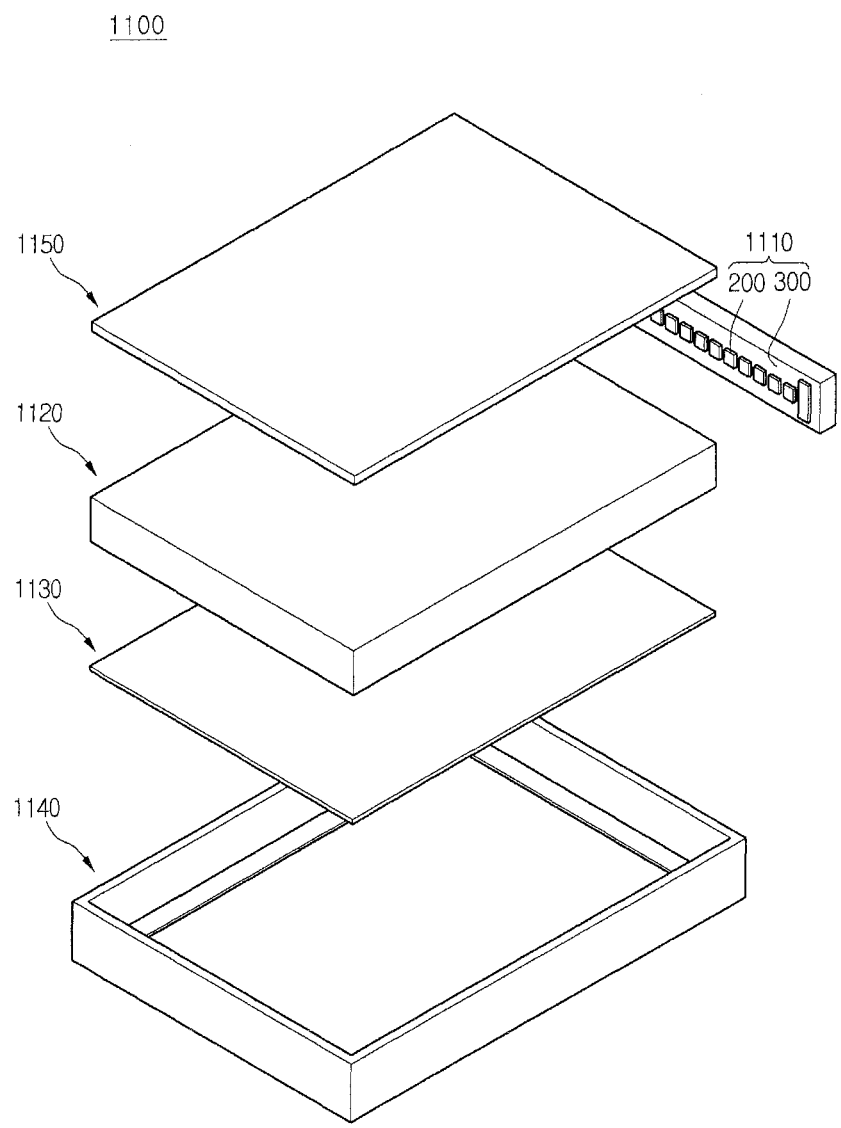
FIG. 10 is a view illustrating a backlight unit including a light emitting device or light emitting device package according to an embodiment.

FIG. 10 is a view illustrating a backlight unit including a light emitting device or light emitting device package according to an embodiment, wherein a back light unit 1100 of FIG. 10 is an example of the lighting system, and the back light unit is not limited thereto.

Referring to FIG. 10, the back light unit 1100 may include a bottom frame 1140, a light guide member 1120 arranged within the bottom frame 1140, and a light emitting module 1110 arranged on at least one of the side and bottom of the light guide member 1120. Additionally, a reflective sheet 1130 may be arranged under the light guide member 1120.

Although the bottom frame 1140 may be formed from such materials as metals and resins, and formed in a box shape of which the top is opened such that the light guide member 1120, back light unit 1100, and reflective sheet 1130 may be housed in bottom frame 1140, the bottom frame 1140 is not limited thereto.

The light emitting module 1110 may include a board 300, and plural light emitting device packages 200 according to embodiments mounted on the board 300. The plural light emitting device packages 200 are capable of supplying light to the light guide member 1120.

As illustrated in FIG. 10, the light emitting module 1110 may be arranged on at least one of inner sides of the bottom frame 1140, and light is capable of being supplied toward at least one side of the light guide member 1120 accordingly.

The light emitting module 1110 is arranged under the bottom frame 1140 to supply light toward the bottom of the light guide member 1120, and arrangement of the light emitting module 1110 is not limited thereto since the arrangement of the light emitting module 1110 is capable of being diversely varied according to design of the back light unit 1100.

The light guide member 1120 may be arranged within the bottom frame 1140. The light guide member 1120 is capable of guiding the light to a display panel (which is not shown in drawings) after subjecting light supplied from the light emitting module 1110 to surface light source conversion.

For instance, the light guide member 1120 may be a light guide plate (LGP). The light guide plate may be formed from one selected from acrylic resins such as polymethyl metaacrylate (PMMA), and polyethylene terephthalate (PET), polycarbonate (PC), cyclic olefin copolymer (COC), and polyethylene naphthalate (PEN).

An optical sheet 1150 may be arranged on the top of the light guide member 1120.

Examples of the optical sheet 1150 may include at least one of a diffusion sheet, a light collection sheet, a brightness enhanced sheet, and a fluorescence sheet. For example, the optical sheet 1150 may be formed by laying up the diffusion sheet, light collection sheet, brightness enhanced sheet, and fluorescence sheet. In this case, the diffusion sheet 1150 evenly diffuses light emitted from the light emitting module 1110, and the diffused light can be collected into a display panel (which is not illustrated in drawings) by the light collection sheet. Light emitted from the light collection sheet is randomly polarized light, wherein the brightness enhanced sheet is capable of increasing degree of polarization of the light emitted from the light collection sheet. For instance, the light collection sheet may be a horizontal prism sheet or/and a vertical prism sheet. Further, the brightness enhanced sheet may be a dual brightness enhancement film. Further, the fluorescence sheet may be a light-transmitting plate or film comprising a phosphor.

The reflective sheet 1130 may be arranged under the light guide member 1120. The reflective sheet 1130 is capable of reflecting light emitted through the bottom of the light guide member 1120 toward the emitting surface of the light guide member 1120.

Although the reflective sheet 1130 may be formed from resins such as PET, PC, and PVC, the resins of the reflective sheet 1130 are not limited thereto.

Figure 11:
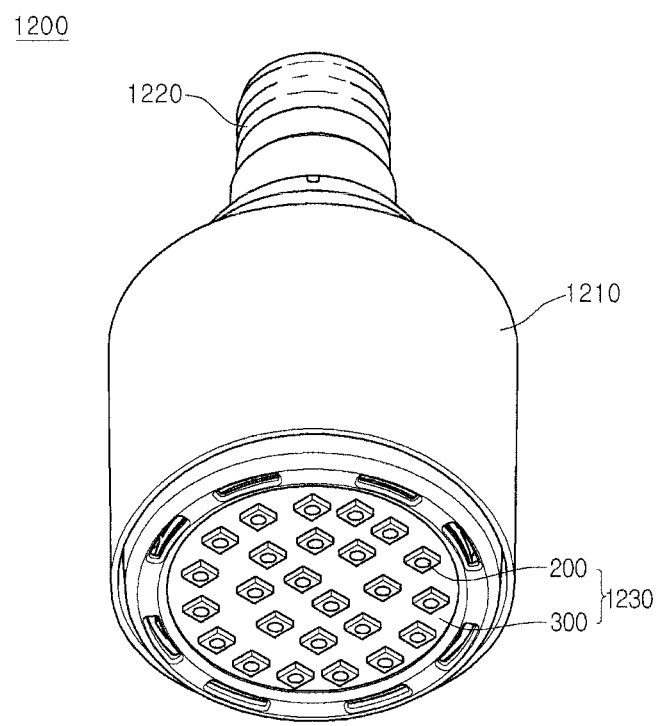
FIG. 11 is a perspective view of a lighting unit including light emitting devices or light emitting device packages according to embodiments.

FIG. 11 is a perspective view of a lighting unit including light emitting devices or light emitting device packages according to embodiments, wherein a lighting unit 1200 of FIG. 11 is an example of the lighting system, and the lighting system is not limited thereto.

Referring to FIG. 11, the lighting unit 1200 may include a case body 1210, a light emitting module 1230 installed in the case body 1210, and a connecting terminal 1220 installed on the case body 1210 to receive a power source from the external power supply.

Preferably, the case body 1210 is formed from material having good heat dissipation properties, and the case body 1210 may be formed from materials such as metals and resins.

The light emitting module 1230 may include a board 300, and one or more light emitting device packages 200 according to an embodiment mounted on the board 300.

The board 300 may be an insulator on which circuit patterns are printed, and examples of the board 300 may include an ordinary printed circuit board (PCB), a metal core PCB, a flexible PCB, and a ceramic PCB.

Further, the board 300 may be formed from material that reflects light efficiently, or may be formed in colors including white and silver such that the surface of the board 300 having those colors is reflected efficiently.

One or more light emitting device packages 200 according to an embodiment may be mounted on the board 300. Each of the light emitting device packages 200 may include one or more light emitting devices according to an embodiment, and the light emitting devices may be light emitting diodes (LEDs). The light emitting diodes may include colored light emitting diodes which emit colored lights such as red, green, blue, and white lights, and UV light emitting diodes which emit ultraviolet rays.

The light emitting module 1230 may be arranged such that the light emitting module 1230 has a combination of various light emitting diodes in order to obtain color sense and brightness. For instance, a combination of a white light emitting diode, a red light emitting diode, and a green light emitting diode may be arranged in the light emitting module 1230 to secure high color rendering index (CRI). Further, a fluorescence sheet may be additionally arranged in the proceeding path of light emitted from the light emitting module 1230, and the fluorescence sheet changes wavelength of the light emitted from the light emitting module 1230. If the light emitted from the light emitting module 1230 has a blue wavelength range, the fluorescence sheet may include a yellow phosphor, and the light emitted from the light emitting module 1230 may be finally shown as white light after passing through the fluorescence sheet.

The connecting terminal 1220 is electrically connected to the light emitting module 1230 such that the connecting terminal 1220 can supply a power source to the light emitting module 1230. Although the connecting terminal 1220 is a socket type connecting terminal which is turned and inserted into an external power supply such that the connecting terminal is coupled to the power supply, the connecting terminal 1220 is not limited thereto. For instance, the connecting terminal 1220 is formed in a pin shape such that the connecting terminal 1220 may be inserted into the external power supply, or may be connected to the external power supply by wiring.

The foregoing lighting system can obtain desired optical effects by arranging one or more of a light guide member, a diffusion sheet, a light collection sheet, a brightness enhanced sheet, and a fluorescence sheet in the proceeding path of the light emitted from the light emitting module.

As described above, a lighting system according to embodiments is capable of possessing excellent light characteristics by comprising light emitting devices or light emitting device packages according to the embodiments.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device including:
    a substrate that has protrusions on a C-face, and of which unit cells are constructed in a hexagonal structure, wherein the substrate has flat surfaces between the protrusions;
    a semiconductor layer that is formed on the substrate, in which empty spaces are formed in sides of the protrusions, and of which unit cells are constructed in a hexagonal structure; and
    a light emitting structure layer including a first conductive semiconductor layer, a second conductive semiconductor layer and an active layer formed between the first conductive semiconductor layer and the second conductive semiconductor layer that are formed on the semiconductor layer, wherein an A-face of the substrate and an A-face of the semiconductor layer form an angle of greater than zero degree, and the protrusions include the R-faces, and
    wherein the empty spaces are disposed in a boundary region between the protrusion and the flat surface.

2. The light emitting device according to claim 1, wherein the protrusions are formed in a hemispherical shape.

3. The light emitting device according to claim 1, wherein the empty spaces are formed in plural portions on the sides of the protrusions.

4. The light emitting device according to claim 3, wherein the empty spaces are formed in six portions on the sides of the protrusions.

5. The light emitting device according to claim 1, wherein the empty spaces are formed in portions where M-faces of the protrusions encounter with one another.

6. The light emitting device according to claim 1, wherein the semiconductor layer is an undoped GaN layer.

7. The light emitting device according to claim 1, wherein the empty spaces are surrounded by the sides of the protrusions and the semiconductor layer.

8. The light emitting device according to claim 1, wherein the A-face of the substrate is parallel to the M-face of the semiconductor layer.

9. The light emitting device according to claim 1, wherein the substrate is a sapphire substrate.

10. The light emitting device according to claim 1, wherein the A-face of the substrate and the A-face of the semiconductor layer form an angle of 30 degrees.

11. A light emitting device package including:
    a package body;
    a first electrode and a second electrode electrically separated from each other on the package body;
    a light emitting device electrically connected to the first electrode and the second electrode on the package body; and
    a molding member surrounding the light emitting device on the package body, wherein the light emitting device includes:
        a substrate which that has protrusions on a C-face, and of which unit cells are constructed in a hexagonal structure, wherein the substrate has flat surfaces between the protrusions;
        a semiconductor layer that is formed on the substrate, in which empty spaces are formed in sides of the protrusions, and of which unit cells are constructed in a hexagonal structure; and
        a light emitting structure layer including a first conductive semiconductor layer, a second conductive semiconductor layer, and an active layer formed between the first conductive semiconductor layer and the second conductive semiconductor layer that are formed on the semiconductor layer, wherein an A-face of the substrate and an A-face of the semiconductor layer form an angle of greater than zero degree, and the protrusions include the R-faces, and
    wherein the empty spaces are disposed in a boundary region between the protrusion and the flat surface.

12. The light emitting device package according to claim 11, wherein the protrusions are formed in a hemispherical shape.

13. The light emitting device package according to claim 11, wherein the empty spaces are formed in plural portions on the sides of the protrusions.

14. The light emitting device package according to claim 13, wherein the empty spaces are formed in six portions on the sides of the protrusions.

15. The light emitting device package according to claim 11, wherein the empty spaces are formed in portions where M-faces of the protrusions encounter with one another.

16. The light emitting device package according to claim 11, wherein the semiconductor layer is an undoped GaN layer.

17. The light emitting device package according to claim 11, wherein the empty spaces are surrounded by the sides of the protrusions and the semiconductor layer.

18. The light emitting device package according to claim 11, wherein the A-face of the substrate is parallel to an M-face of the semiconductor layer.

19. The light emitting device package according to claim 11, wherein the substrate is a sapphire substrate.

20. A lighting system using light emitting devices as a light source, the lighting system including a light emitting module comprising one or more light emitting devices, wherein the light emitting device includes:
   a substrate that has protrusions on a C-face, and of which unit cells are constructed in a hexagonal structure, wherein the substrate has flat surfaces between the protrusions;
   a semiconductor layer that is formed on the substrate, in which empty spaces are formed in sides of the protrusions, and of which unit cells are constructed in a hexagonal structure; and
   a light emitting structure layer including a first conductive semiconductor layer, a second conductive semiconductor layer, and an active layer formed between the first conductive semiconductor layer and the second conductive semiconductor layer that are formed on the semiconductor layer, wherein an A-face of the substrate and an A-face of the semiconductor layer form an angle of greater than zero degree, and the protrusions include the R-faces, and
   wherein the empty spaces are disposed in a boundary region between the protrusion and the flat surface.

* * * * *